US011146253B1

(12) United States Patent
Jeon et al.

(10) Patent No.: US 11,146,253 B1
(45) Date of Patent: Oct. 12, 2021

(54) RECEIVING CIRCUIT TO PROCESS LOW-VOLTAGE SIGNAL WITH HYSTERESIS

(71) Applicant: Electronics and Telecommunications Research Institute, Daejeon (KR)

(72) Inventors: Young-deuk Jeon, Sejong-si (KR); Young-Su Kwon, Daejeon (KR); Seong Min Kim, Sejong-si (KR); In San Jeon, Daejeon (KR); Min-Hyung Cho, Daejeon (KR); Jin Ho Han, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/105,817

(22) Filed: Nov. 27, 2020

(30) Foreign Application Priority Data

Aug. 24, 2020 (KR) .................. 10-2020-0106367
Nov. 17, 2020 (KR) .................. 10-2020-0153453

(51) Int. Cl.
| | |
|---|---|
| *H03K 3/00* | (2006.01) |
| *H03K 3/3565* | (2006.01) |
| *H03K 19/0185* | (2006.01) |
| *H03K 19/00* | (2006.01) |
| *H03K 5/08* | (2006.01) |

(Continued)

(52) U.S. Cl.
CPC ..... *H03K 3/3565* (2013.01); *G01R 19/16538* (2013.01); *G11C 11/413* (2013.01); *H03K 5/088* (2013.01); *H03K 19/0013* (2013.01); *H03K 19/018521* (2013.01)

(58) Field of Classification Search
None
See application file for complete search history.

(56) References Cited

U.S. PATENT DOCUMENTS

| 5,880,616 A | 3/1999 | Park et al. |
|---|---|---|
| 8,723,584 B2 | 5/2014 | Larsen et al. |
| (Continued) | | |

FOREIGN PATENT DOCUMENTS

KR     10-2016-0043207     4/2016

OTHER PUBLICATIONS

Shih-Lun Chen et al., "A New Schmitt Trigger Circuit in a 0.13-μm 1/2.5-V CMOS Process to Receive 3.3-V Input Signals", IEEE Transactions on Circuits and Systems—II: Express Briefs, Jul. 2005, pp. 361-365, vol. 52, No. 7.

*Primary Examiner* — Tuan T Lam
(74) *Attorney, Agent, or Firm* — Kile Park Reed & Houtteman PLLC

(57) ABSTRACT

Disclosed is a receiving circuit, which includes a hysteresis detector that receives an input signal corresponding to a first voltage level and outputs a detection signal having a first threshold voltage and a second threshold voltage, and a level shifter that receives the detection signal, converts the first voltage level of the detection signal to a second voltage level higher than the first voltage level so as to be output as an output signal, and outputs a feedback signal of the second voltage level, and the hysteresis detector receives the feedback signal from the level shifter and adjusts the first threshold voltage and the second threshold voltage based on the feedback signal.

16 Claims, 12 Drawing Sheets

(51) Int. Cl.
*G11C 11/413* (2006.01)
*G01R 19/165* (2006.01)

(56) References Cited

U.S. PATENT DOCUMENTS

| | | | |
|---|---|---|---|
| 8,829,964 B1* | 9/2014 | Williams | H03K 3/011 |
| | | | 327/206 |
| 9,496,874 B2 | 11/2016 | Kim | |
| 2003/0001645 A1* | 1/2003 | Nair | H03K 3/012 |
| | | | 327/206 |
| 2005/0218950 A1* | 10/2005 | Kamei | H03K 3/013 |
| | | | 327/205 |
| 2009/0189665 A1 | 7/2009 | Wu et al. | |
| 2014/0132326 A1 | 5/2014 | Kim et al. | |
| 2017/0331465 A1* | 11/2017 | Bogi | H03K 3/3565 |
| 2019/0158085 A1* | 5/2019 | Rizvi | H03K 19/017509 |
| 2019/0260361 A1* | 8/2019 | Rommel | H03K 3/356008 |

* cited by examiner

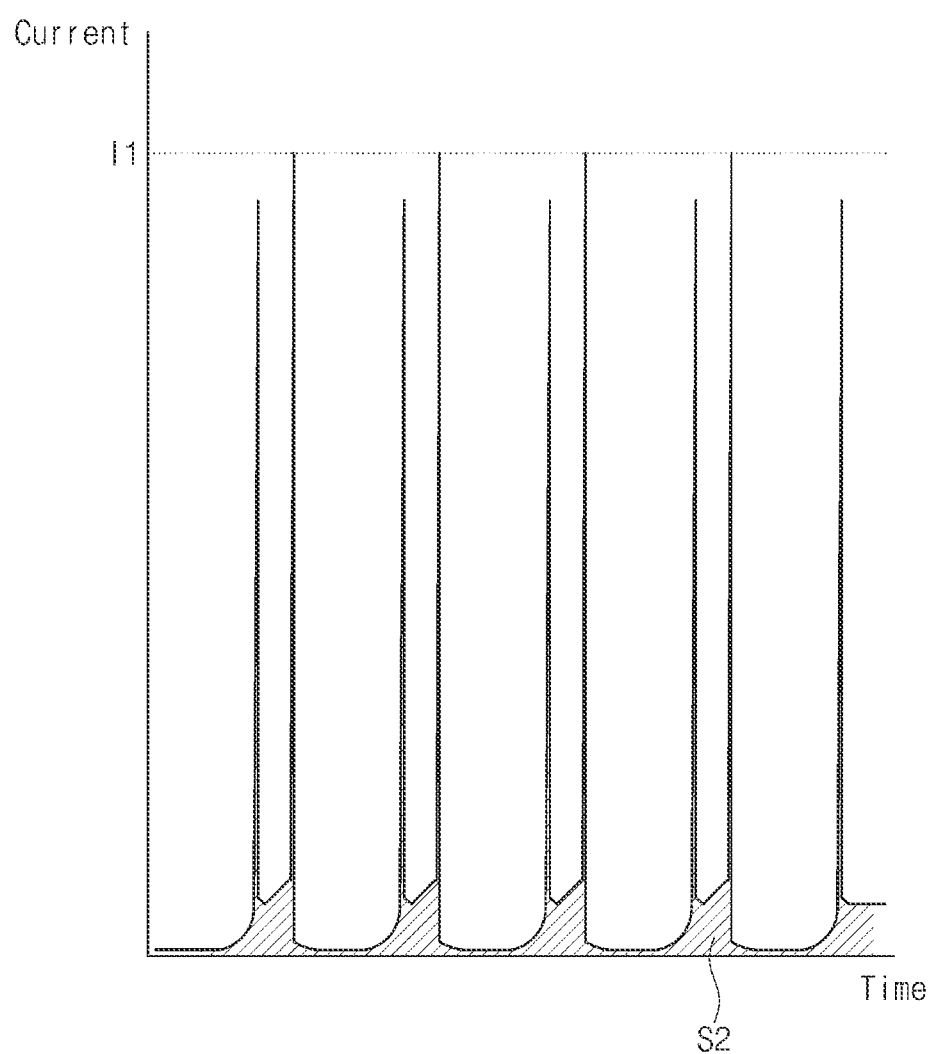

US 11,146,253 B1

RECEIVING CIRCUIT TO PROCESS LOW-VOLTAGE SIGNAL WITH HYSTERESIS

CROSS-REFERENCE TO RELATED APPLICATIONS

This application claims priority under 35 U.S.C. § 119 to Korean Patent Application Nos. 10-2020-0106367 filed on Aug. 24, 2020 and 10-2020-0153453 filed on Nov. 17, 2020, in the Korean Intellectual Property Office, the disclosures of which are incorporated by reference herein in their entireties.

BACKGROUND

Embodiments of the present disclosure disclosed herein relate to a semiconductor memory, and more particularly, relate to a receiving circuit processing a low-voltage signal with a hysteresis.

A semiconductor memory is classified as a volatile memory, in which stored data disappear when a power is turned off, such as a static random access memory (SRAM) or a dynamic random access memory (DRAM), or a non-volatile memory, in which stored data are retained even when a power is turned off, such as a flash memory, a phase-change RAM (PRAM), a magnetic RAM (MRAM), a resistive RAM (RRAM), or a ferroelectric RAM (FRAM).

According to the recent mobile trend, there is required a high-integration, high-performance, and low-power semiconductor integrated circuit. A low-power semiconductor integrated circuit may be implemented in various manners. In a low-power double data rate (LPDDR) memory and a mobile system-on-chip (SoC) using the LPDDR memory, there is a demand on improving energy efficiency through circuits, the adjustment of a power supply voltage, and the like and through the classification of operating modes into a high-speed mode where data are transmitted at a high speed and a low-speed mode where data are transmitted at a low speed.

SUMMARY

Embodiments of the present disclosure provide a receiving circuit capable of reducing a static current and the area and capable of processing a low-voltage signal having a hysteresis providing a characteristic of filtering a noise of an input signal.

According to one or more embodiments of the present disclosure, a receiving circuit includes a hysteresis detector that receives an input signal corresponding to a first voltage level and outputs a detection signal having a first threshold voltage and a second threshold voltage, and a level shifter that receives the detection signal, converts the first voltage level of the detection signal to a second voltage level higher than the first voltage level so as to be output as an output signal, and outputs a feedback signal of the second voltage level, and the hysteresis detector receives the feedback signal from the level shifter and adjusts the first threshold voltage and the second threshold voltage based on the feedback signal.

The hysteresis detector includes a first PMOS transistor that is connected between a node of receiving a first power supply voltage and a first node and operates in response to the input signal, a second PMOS transistor that is connected between the first node and a second node and operates in response to the input signal, a first NMOS transistor that is connected between the second node and a third node and operates in response to the input signal, a second NMOS transistor that is connected between the third node and a ground node and operates in response to the input signal, a third PMOS transistor that is connected between the first node and a node of receiving a reference voltage and operates in response to the feedback signal, a third NMOS transistor that is connected between the third node and the node of receiving the reference voltage and operates in response to the feedback signal, a first inverter that inverts the detection signal being a signal of the second node to output an inverted detection signal, and a second inverter that inverts the inverted detection signal to output an second detection signal.

The level shifter includes a fourth PMOS transistor that is connected between a node of receiving a second power supply voltage and a fourth node and operates in response to a signal of a fifth node, a fifth PMOS transistor that is connected between the node of receiving the second power supply voltage and the fifth node and operates in response to a signal of the fourth node, a fourth NMOS transistor that is connected between the fourth node and the ground node and operates in response to the inverted detection signal, and a fifth NMOS transistor that is connected between the fifth node and the ground node and operates in response to the second detection signal.

The feedback signal corresponds to the signal of the fourth node, and the output signal corresponds to the signal of the fifth node.

The first voltage level is lower than a level of the first power supply voltage.

The second voltage level corresponds to a level of the second power supply voltage.

A level of the first power supply voltage is higher than a level of the reference voltage, and a level of the second power supply voltage is higher than the level of the first power supply voltage.

When a level of the input signal is equal to or higher than a level of the first threshold voltage, the output signal transitions from logic low to logic high at a rising edge of the input signal. When the level of the input signal is lower than a level of the second threshold voltage, the output signal transitions from the logic high to the logic low at a falling edge of the input signal.

As a level of the reference voltage increases, the level of the first threshold voltage increases, and the level of the second threshold voltage increases.

As a level of the reference voltage increases, an increment of the level of the first threshold voltage is greater than an increment of the level of the second threshold voltage.

According to one or more embodiments of the present disclosure, a receiving circuit includes a hysteresis detector that receives an input signal, outputs a detection signal having a first threshold voltage and a second threshold voltage, and uses a first power supply voltage and a reference voltage, and a level shifter that receives the detection signal, converts a voltage level of the detection signal so as to be output as an output signal, provides a feedback signal to the hysteresis detector, and uses a second power supply voltage greater than the first power supply voltage. The hysteresis detector includes a first PMOS transistor that is connected between a node of receiving the first power supply voltage and a first node and operates in response to the input signal, a second PMOS transistor that is connected between the first node and a second node and operates in response to the input signal, a first NMOS transistor that is connected between the second node and a third node and operates in response to the input signal, a second NMOS transistor that is connected between the third node and a ground node and operates in response to the input signal, a third PMOS transistor that is connected between the first node and a node of receiving the reference voltage and operates in response to the feedback signal, a third NMOS transistor that is connected between the third node and the node of receiving the reference voltage and operates in response to the feedback signal, a first inverter that receives the detection signal and inverts the detection signal so as to be output as an inverted detection signal, and a second inverter that receives the inverted detection signal so as to be output as a the second detection signal. The level shifter includes a fourth PMOS transistor that is connected between a node of receiving the second power supply voltage and a fourth node and operates in response to a signal of a fifth node, a fifth PMOS transistor that is connected between the node of receiving the second power supply voltage and the fifth node and operates in response to a signal of the fourth node, a fourth NMOS transistor that is connected between the fourth node and the ground node and operates in response to the inverted detection signal, and a fifth NMOS transistor that is connected between the fifth node and the ground node and operates in response to the second detection signal.

The receiving circuit further includes a reference voltage controller that receives the input signal and adjusts a level of the reference voltage based on a voltage level of the input signal.

When a level of the input signal is equal to or higher than a level of the first threshold voltage, the output signal transitions from logic low to logic high at a rising edge of the input signal. When the level of the input signal is lower than a level of the second threshold voltage, the output signal transitions from the logic high to the logic low at a falling edge of the input signal.

The hysteresis detector adjusts a level of the first threshold voltage and a level of the second threshold voltage based on a level of the reference voltage.

A voltage level of the input signal is variable and is equal to or lower than a level of the first power supply voltage.

A voltage level of the feedback signal is equal to or higher than a level of the first power supply voltage.

BRIEF DESCRIPTION OF THE FIGURES

The above and other objects and features of the present disclosure will become apparent by describing in detail one or more embodiments thereof with reference to the accompanying drawings.

FIGS. 3A and 3B are graphs illustrating current consumption of a receiving circuit.

DETAILED DESCRIPTION

Below, embodiments of the present disclosure may be described in detail and clearly to such an extent that an ordinary one in the art easily implements the present disclosure.

Figure 1:
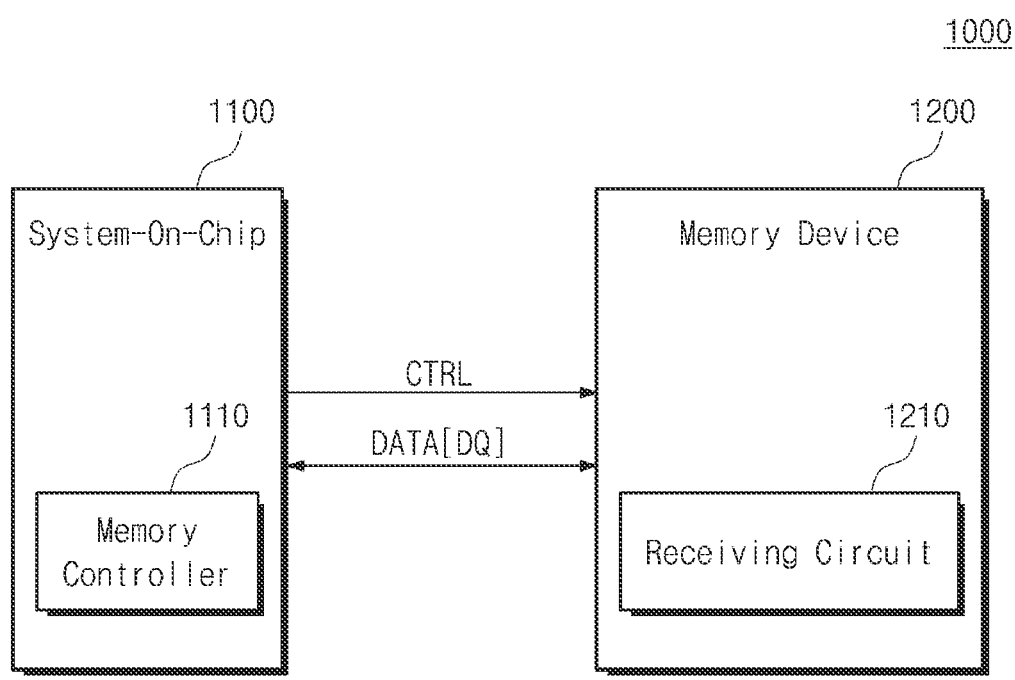
FIG. 1 is a block diagram illustrating an electronic device according to an embodiment of the present disclosure.

FIG. 1 is a block diagram illustrating an electronic device according to an embodiment of the present disclosure. Referring to FIG. 1, an electronic device 1000 may include a system-on-chip (SoC) 1100 and a memory device 1200. For example, the electronic device 1000 may be one of various computing devices such as a desktop computer, a laptop computer, a workstation, a server, a smartphone, a tablet PC, a digital camera, and a black box.

The SoC 1100 may control overall operations of the electronic device 1000. For example, SoC 1100 may be an application processor (AP) configured to control the overall operations of the electronic device 1000. The SoC 1100 may run an operating system, a program, or an application that is executable on the electronic device 1000.

The SoC 1100 may store data in the memory device 1200 or may read data stored in the memory device 1200. The SoC 1100 may include a processor (not illustrated) and a memory controller 1110. The processor may perform various operations of the electronic device 1000 and may process data.

The memory controller 1110 may control the memory device 1200. For example, the memory controller 1110 may provide the memory device 1200 with a control signal CTRL for controlling the memory device 1200 and may exchange data "DATA" with the memory device 1200 through a data line DQ. For example, the control signal CTRL may include a command/address signal CA, a command latch enable signal CLE, an address latch enable signal ALE, a read enable signal RE/, a write enable signal WE, and the like.

The memory device 1200 may operate under control of the memory controller 1110. For example, in response to signals received from the memory controller 1110, the memory device 1200 may store the data "DATA" or may provide the stored data "DATA" to the memory controller 1110. In one embodiment, the memory device 1200 may be a dynamic random access memory (DRAM) device, but the present disclosure is not limited thereto.

In one embodiment, the memory controller 1110 and the memory device 1200 may communicate with each other based on a given interface. The given interface may be a low-power double data rate (LPDDR), but the present disclosure is not limited thereto. For example, the given interface may include at least one of various interfaces such as a DDR interface, a universal serial bus (USB) interface, a multimedia card (MMC) interface, a peripheral component interconnection (PCI) interface, a PCI-express (PCI-E) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), and a nonvolatile memory-express (NVMe) interface.

In one embodiment, the memory controller 1110 and the memory device 1200 may communicate with each other in compliance with the protocol of the LPDDR 4.0 specification or the protocol of the LPDDR 5.0 specification.

In one embodiment, the memory device 1200 may include a receiving circuit 1210. The receiving circuit 1210 may use various levels of power supply voltages as an operation voltage. That is, the receiving circuit 1210 may use a high voltage VDDH (e.g., 0.9 V or 1.05 V) or a low voltage VDD (e.g., 0.5 V). The receiving circuit 1210 according to an embodiment of the present disclosure may include transistors that are formed by using a low-voltage process.

The receiving circuit 1210 may receive an input signal. For example, the input signal may be a data signal received through data lines DQ or may be the control signal CTRL received through control lines. The input signal may be a signal that complies with the low voltage swing terminated logic (LVSTL) standard. A voltage level of the input signal may correspond to a low voltage (VDD) level or may be lower than the low voltage (VDD) level. The voltage level of the input signal may be variable. For example, in the case where the input signal swings at a low voltage level, a voltage level of the input signal may change due to impedance or channel loss. For this reason, the receiving circuit 1210 may need to adjust a threshold voltage.

In one embodiment, the receiving circuit 1210 may generate an output signal having a hysteresis characteristic based on the input signal. The receiving circuit 1210 may convert the input signal corresponding to the low voltage (VDD) level (or belonging to a low voltage (VDD) domain) to the output signal corresponding to a high voltage (VDDH) level (or belonging to a high voltage (VDDH) domain). The high voltage VDDH may be a voltage that is used in a logic circuit. The receiving circuit 1210 may provide the output signal to the logic circuit. A configuration and an operation of the receiving circuit 1210 will be more fully described with reference to the following drawings.

Figure 2A:
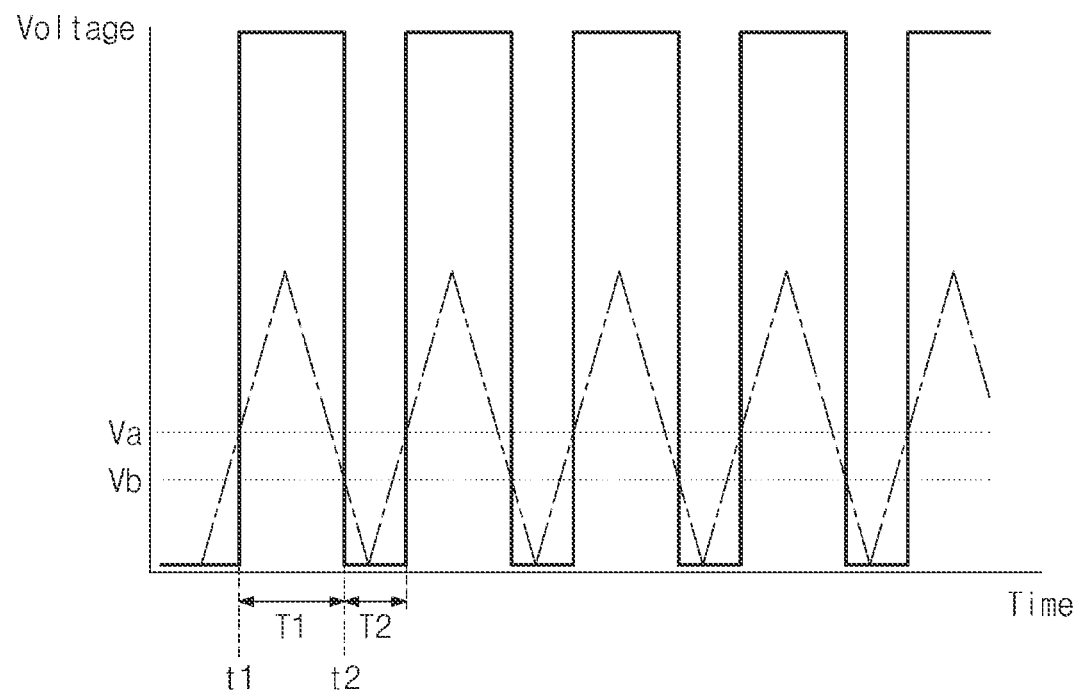
FIGS. 2A and 2B are graphs illustrating an input signal and an output signal of a receiving circuit.
Figure 2B:
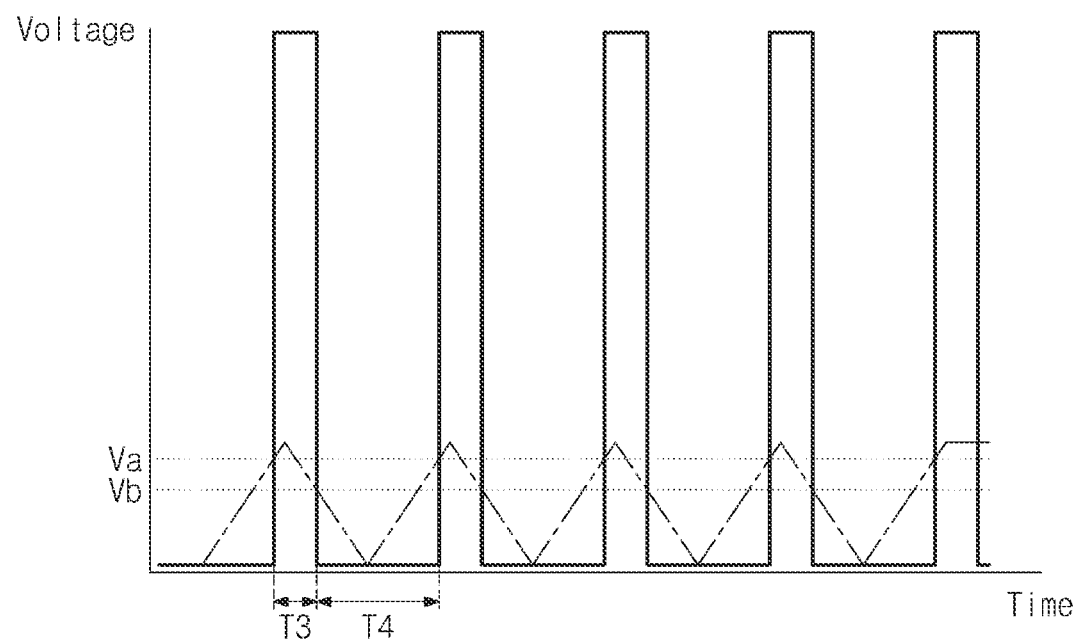

FIGS. 2A and 2B are graphs illustrating an input signal and an output signal of a receiving circuit. An embodiment in which a first input signal having a swing range of the low voltage (VDD) level is received is illustrated in FIG. 2A, and an embodiment in which a second input signal having a swing range of a level (e.g., VDD/2) lower than the low voltage (VDD) level is received is illustrated in FIG. 2B. In FIGS. 2A and 2B, a horizontal axis represents a time, and a vertical axis represents a voltage. To describe the present disclosure clearly, in FIG. 2A, the first input signal is illustrated by a dash-single dotted line, and a first output signal is illustrated by a solid line. In FIG. 2B, the second input signal is illustrated by a dash-single dotted line, and a second output signal is illustrated by a solid line.

Referring to FIGS. 2A and 2B, a receiving circuit may provide a hysteresis effect to an output signal based on an input signal, by using a Schmitt trigger circuit (or a hysteresis detector). Assuming that the output signal transitions at a level reference of the input signal, the receiving circuit may provide different level references at a rising edge and a falling edge of the input signal.

For example, when the voltage level of the first input signal is equal to or higher than a level of a first threshold voltage VIH (e.g., a first voltage Va), the receiving circuit may allow the first output signal to transition at a rising edge of the first input signal. That is, the receiving circuit may allow the first output signal to transition from logic low to logic high at a first time t1. When the voltage level of the first input signal is lower than a level of a second threshold voltage VIL (e.g., a second voltage Vb), the receiving circuit may allow the first output signal to transition at a falling edge of the first input signal. That is, the receiving circuit may allow the first output signal to transition from logic high to logic low at a second time t2.

As in the above description, when the voltage level of the second input signal is equal to or higher than the level of the first threshold voltage VIH (e.g., the first voltage Va), the receiving circuit may allow the second output signal to transition at a rising edge of the second input signal. When the voltage level of the second input signal is lower than the level of the second threshold voltage VIL (e.g., the second voltage Vb), the receiving circuit may allow the second output signal to transition at a falling edge of the second input signal.

The receiving circuit may differently set the first and second threshold voltages VIH and VIL. As such, even though a glitch or fluctuation occurs at an input signal due to an external noise and signal interference, the receiving circuit may generate a stable output signal.

Referring to FIG. 2A, the first output signal may be maintained at logic high during a first time period T1 and may be maintained at logic low during a second time period T2. The receiving circuit that receives the first input signal may generate the first output signal that is stable.

Referring to FIG. 2B, the second output signal may be maintained at logic high during a third time period T3 and may be maintained at logic low during a fourth time period T4. The level of the first threshold voltage VIH (e.g., the first voltage Va) and the level of the second threshold voltage VIL (e.g., the second voltage Vb) may be relatively high compared to the voltage level of the second input signal. As such, the third time period T3 may be excessively short compared to the first time period T1, and the fourth time period T4 may be excessively long compared to the second time period T2. That is, the receiving circuit may provide the second output signal in which the third time period T3 and the fourth time period T4 are out of balance.

Even though the voltage levels of the first input signal and the second input signal are different, the level of the first threshold voltage VIH and the level of the second threshold voltage VIL may be equal. The level of the first threshold voltage VIH and the level of the second threshold voltage VIL may be determined depending on the size or area of a PMOS transistor or an NMOS transistor. In other words, regardless of a voltage level of an input signal, the level of the first threshold voltage VIH and the level of the second threshold voltage VIL may be determined based on the size of a transistor.

As such, in the case where a voltage level of an input signal is variable, there may be a problem of generating a stable output signal. In other words, in the case where a voltage level of an input signal is variable, there may be a need to adjust the level of the first threshold voltage VIH and the level of the second threshold voltage VIL.

Figure 3A:
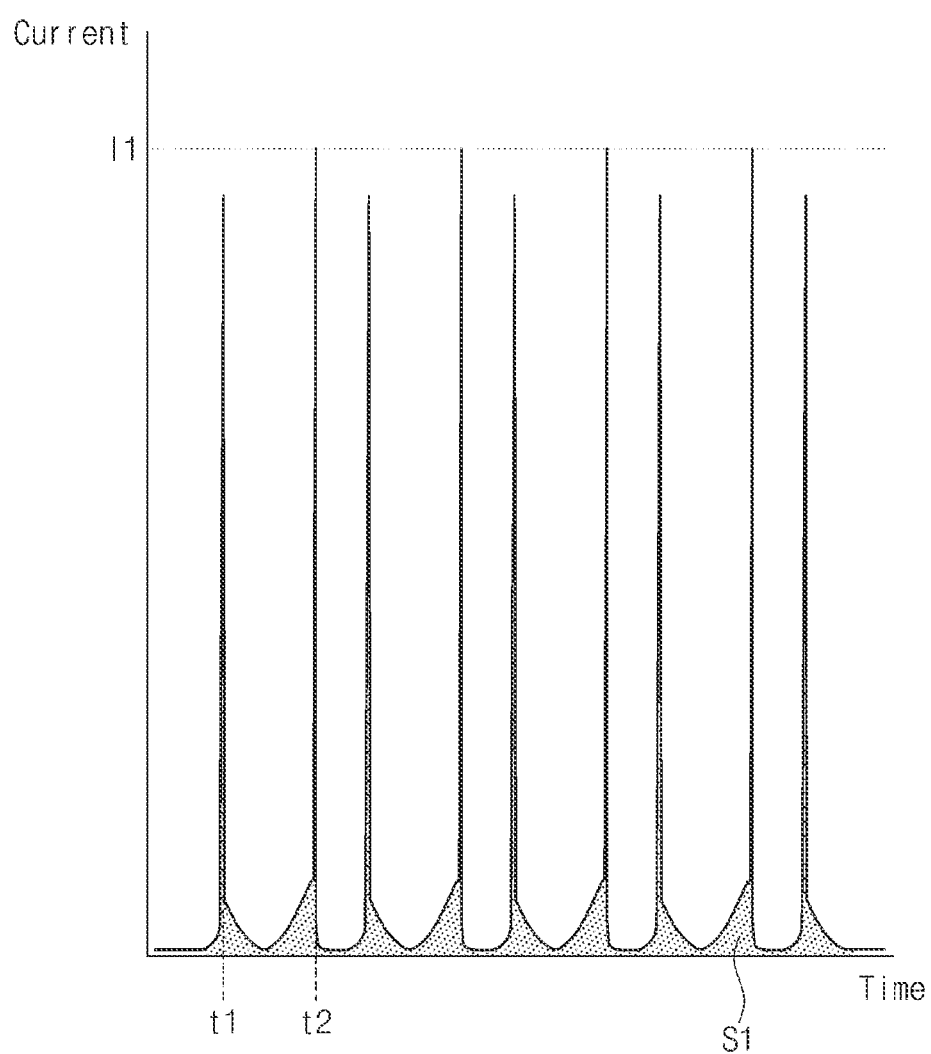

FIGS. 3A and 3B are graphs illustrating current consumption of a receiving circuit. An embodiment in which the first input signal having the swing range of the low voltage (VDD) level is received is illustrated in FIG. 3A, and an embodiment in which the second input signal having the swing range of the level (e.g., VDD/2) lower than the low voltage (VDD) level is received is illustrated in FIG. 3B. In FIGS. 3A and 3B, a horizontal axis represents a time, and a vertical axis represents a current.

Referring to FIGS. 3A and 3B, even though an output signal is not illustrated, a peak current may be generated when the output signal transitions from logic low to logic high or transitions from logic high to logic low. For example, at the first time t1 and the second time t2, a peak current, that is, a first current I1 corresponding to a maximum current may be consumed.

In the graph of FIG. 3A, the first area s1 represents a total amount of a current that is consumed during a given time by the receiving circuit receiving the first input signal. In the graph of FIG. 3B, the second area s2 represents a total amount of a current that is consumed during the given time by the receiving circuit receiving the second input signal. It is confirmed from FIGS. 3A and 3B that the second area s2 is larger than the first area s1. That is, like the second input signal, in the case where a swing range of an input signal is lower than a low voltage level, the amount of current consumption may increase.

In a receiving circuit that receives an input signal, of which a voltage level corresponds to a power supply voltage level, a static current and a leakage current may not occur. The receiving circuit may consume a current during a short time period, that is, only a time period where an output signal transitions from logic low to logic high or transitions from logic high to logic low. In contrast, in a receiving circuit that receives an input signal, of which a voltage level is lower than the power supply voltage level, a static current and a leakage current may occur. As such, power consumption may increase.

In the case where a voltage level of an input signal is low, to switch an NMOS transistor to a turn-on state, the NMOS transistor need to be designed to be dozens of times larger in size than a PMOS transistor. As the total area of transistors increases, a parasitic capacitance may increase, thereby causing a decrease of an operating speed and an increase of static current consumption. Because an input signal swings at a low voltage level, a turn-off state or a turn-on state of a PMOS transistor may not be clear. A PMOS transistor may operate in a triode state or a saturation state. This causes a static current.

Before the LPDDR 4.0/5.0 specification, the memory controller 1110 and the memory device 1200 may operate in a high-speed mode or a low-speed mode to make the energy efficiency high. In the high-speed mode, a physical layer PHY included in each of the memory controller 1110 and the memory device 1200 may compensate for a channel loss by using an equalizer such as a continuous time linear equalizer (CTLE) or a decision feedback equalizer (DFE). The equalizer such as the continuous time linear equalizer (CTLE) or the decision feedback equalizer (DFE) may consume a lot of power and may be complicated in circuit. In the low-speed mode, because a channel loss of data is small compared to the high-speed mode, the PHY may use a Schmitt trigger circuit. The Schmitt trigger circuit may have a digital circuit-based low-power structure and may be simple in circuit.

In the LPDDR 4.0/5.0 specification, the memory controller 1110 and the memory device 1200 may transmit/receive data swinging at a low voltage level by using an LVSTL (Low Voltage Swing Terminated Logic) technology. In particular, in the LPDDR 5.0 specification where a voltage level of an input signal decreases, the input signal may swing between 0 mV and 140 mV. As such, in the case of adopting the Schmitt trigger circuit used in the conventional low-speed mode, issues such as a leakage current and an increase of the area may occur.

Figure 4:
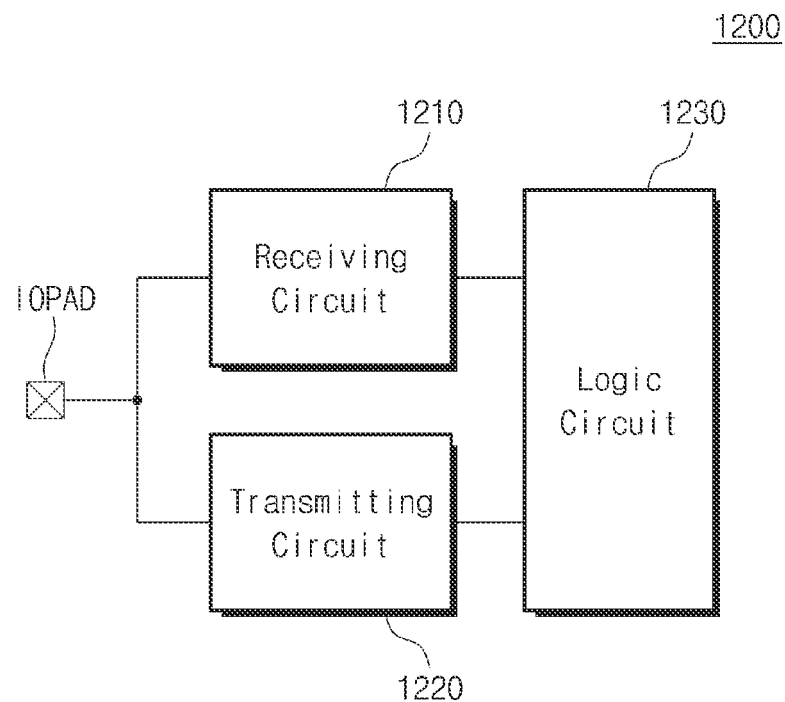
FIG. 4 is a block diagram illustrating a memory device of FIG. 1.

FIG. 4 is a block diagram illustrating a memory device of FIG. 1. Referring to FIGS. 1 and 4, the memory device 1200 may include an input/output pad IOPAD, the receiving circuit 1210, a transmitting circuit 1220, and a logic circuit 1230. The receiving circuit 1210 may receive data or a control signal through the input/output pad IOPAD and may provide the received data or control signal to the logic circuit 1230. That is, the receiving circuit 1210 may generate an output signal based on an input signal provided from the input/output pad IOPAD and may provide the output signal to the logic circuit 1230.

In one embodiment, the receiving circuit 1210 may provide a hysteresis effect to an output signal based on an input signal. The receiving circuit 1210 may provide high performance of filtering a noise of an input signal having a swing range of the low voltage (VDD) level or lower. With regard to an input signal having a variable voltage level, the receiving circuit 1210 may adjust the first threshold voltage VIH and the second threshold voltage VIL to provide a stable output signal.

In one embodiment, the receiving circuit 1210 may convert the input signal having the swing range of the low voltage (VDD) level or lower to an output signal having a swing range of the high voltage (VDDH) level and may provide the output signal to the logic circuit 1230. That is, a voltage level of the output signal that is output from the receiving circuit 1210 may be relatively high compared to that of the input signal.

A voltage level of the input signal provided from the input/output pad IOPAD and a voltage level of a signal capable of being processed by the logic circuit 1230 may be different. For example, in the low-speed mode where data are transmitted at a low speed, the receiving circuit 1210 may receive the input signal by using the low voltage VDD for the purpose of making energy efficiency high. In this case, the receiving circuit 1210 may compensate for a difference between signal levels. That is, in the case where the logic circuit 1230 uses the high voltage VDDH as a power supply voltage, the receiving circuit 1210 may convert the voltage level of the input signal to generate an output signal corresponding to the high voltage (VDDH) level (or belonging to the high voltage (VDDH) domain).

The transmitting circuit 1220 may provide data provided from the logic circuit 1230 to the SoC 1100 through the input/output pad IOPAD. The logic circuit 1230 may be connected with the receiving circuit 1210 and the transmitting circuit 1220. The logic circuit 1230 may use the high voltage VDDH. In one embodiment, the logic circuit 1230 may store data provided from the SoC 1100 through the receiving circuit 1210. The logic circuit 1230 may provide the stored data to the SoC 1100 through the transmitting circuit 1220 in response to signals received from the SoC 1100. For example, the logic circuit 1230 may include a memory cell array, an address decoder, a page buffer circuit, and a control logic circuit.

As described above, the receiving circuit 1210 may generate an output signal, which has a hysteresis characteristic and has a voltage level corresponding to the high voltage VDDH, based on the input signal. The receiving circuit 1210 may remove a leakage current or a static current and may minimize the area. The receiving circuit 1210 may adjust a threshold voltage depending on a level change of an input signal. A structure and a function of the receiving circuit 1210 will be more fully described with reference to the following drawings.

Figure 5:
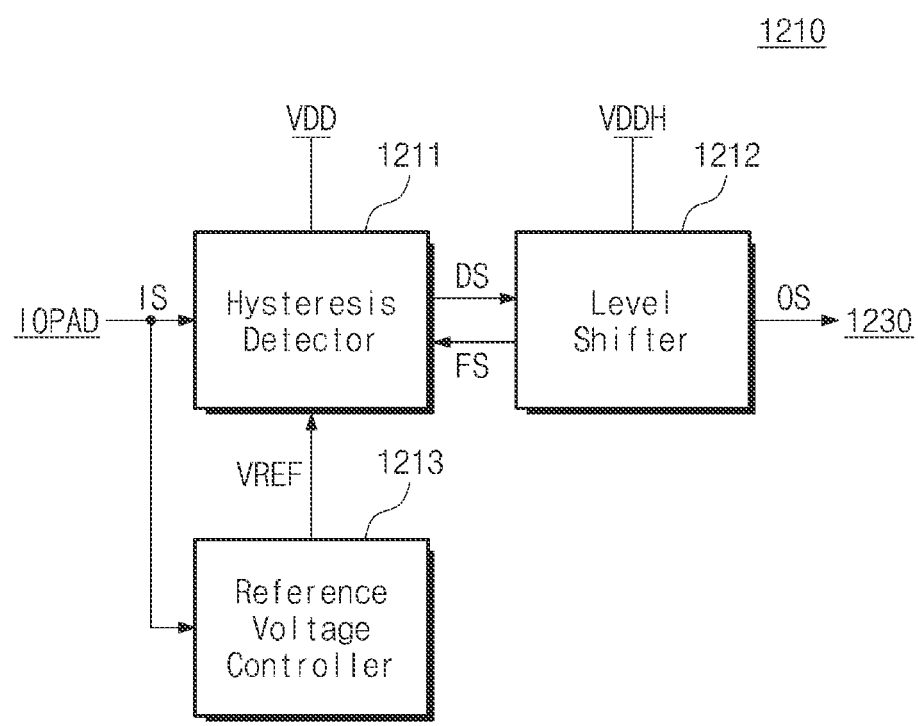
FIG. 5 is a block diagram illustrating a receiving circuit of FIG. 1.

FIG. 5 is a block diagram illustrating a receiving circuit of FIG. 1. Referring to FIGS. 1, 4, and 5, the receiving circuit 1210 may include a hysteresis detector 1211, a level shifter 1212, and a reference voltage controller 1213.

The hysteresis detector 1211 may receive an input signal IS from the input/output pad IOPAD. The hysteresis detector 1211 may generate a detection signal DS having a hysteresis characteristic based on the input signal IS. The hysteresis detector 1211 may provide the detection signal DS to the level shifter 1212. The hysteresis detector 1211 may use the low voltage VDD as a power supply voltage (i.e., may operate in the low voltage (VDD) domain). The hysteresis detector 1211 may receive a reference voltage VREF from the reference voltage controller 1213.

The level shifter 1212 may receive the detection signal DS corresponding to the low voltage VDD (or belonging to the low voltage (VDD) domain). The level shifter 1212 may generate an output signal OS corresponding to the high voltage VDDH (or belonging to the high voltage (VDDH) domain), based on the detection signal DS. That is, the level shifter 1212 may convert the detection signal DS having the swing range of the low voltage (VDD) level to provide the output signal OS having the swing range of the high voltage (VDDH) level. The level shifter 1212 may use the high voltage VDDH as a power supply voltage (i.e., may operate in the high voltage (VDDH) domain). The level shifter 1212 may provide a feedback signal FS to the hysteresis detector 1211. For example, the feedback signal FS may correspond to the high voltage (VDDH) level (i.e., may belong to the high voltage (VDDH) domain). The level shifter 1212 may provide the output signal OS to the logic circuit 1230.

The reference voltage controller 1213 may receive the input signal IS. The reference voltage controller 1213 may generate the reference voltage VREF based on the input signal IS. For example, as a voltage level of the input signal IS decreases, a level of the reference voltage VREF may decrease. That is, the reference voltage controller 1213 may adjust a level of the reference voltage VREF based on the input signal IS. In one embodiment, the reference voltage VREF may be used in the high-speed mode. The reference voltage controller 1213 may provide the reference voltage VREF to the hysteresis detector 1211.

Figure 6:
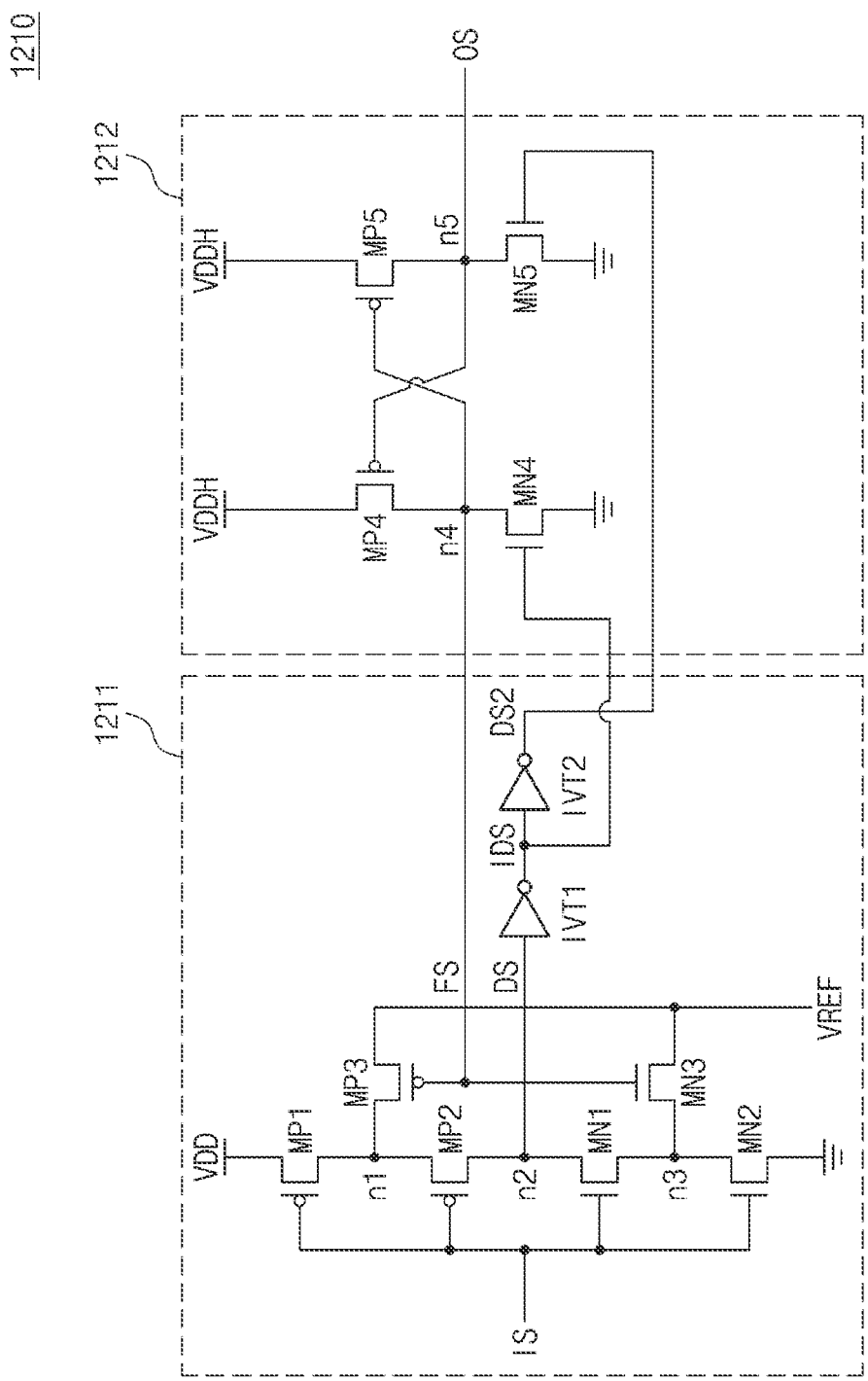
FIG. 6 is a circuit diagram illustrating a hysteresis detector and a level shifter of FIG. 5 in detail.

FIG. 6 is a circuit diagram illustrating a hysteresis detector and a level shifter of FIG. 5 in detail. In one embodiment, the circuit diagram illustrated in FIG. 6 is an example for describing an embodiment of the present disclosure clearly, and the present disclosure is not limited thereto. For example, the circuit diagram illustrated in FIG. 6 may be variously changed or modified in the form of an equivalent circuit so as to perform the same functions or similar functions without departing from the scope and spirit of the present disclosure.

Referring to FIGS. 1, 5, and 6, the hysteresis detector 1211 may include first to third PMOS transistors MP1 to MP3, first to third NMOS transistors MN1 to MN3, and first and second inverters IVT1 and IVT2. The first PMOS transistor MP1 may be connected between a first node n1 and a first power node (i.e., a node of receiving the low voltage VDD) and may operate in response to the input signal IS. The second NMOS transistor MP2 may be connected between the first node n1 and a second node n2 and may operate in response to the input signal IS. The first NMOS transistor MN1 may be connected between the second node n2 and a third node n3 and may operate in response to the input signal IS. The second NMOS transistor MN2 may be connected between the third node n3 and a ground node and may operate in response to the input signal IS.

The third PMOS transistor MP3 may be connected between the first node n1 and a second power node (i.e., a node of receiving the reference voltage VREF) and may operate in response to the feedback signal FS. The third NMOS transistor MN3 may be connected between the third node n3 and the second power node (i.e., the node of receiving the reference voltage VREF) and may operate in response to the feedback signal FS. For example, the feedback signal FS may be provided from the level shifter 1212. The feedback signal FS may be a signal of a fourth node n4 of the level shifter 1212. A voltage level of the feedback signal FS may correspond to the high voltage (VDDH) level.

The hysteresis detector 1211 may output a signal of the second node n2 as the detection signal DS. The hysteresis detector 1211 may provide the detection signal DS and an inverted detection signal IDS to the level shifter 1212.

The first inverter IVT1 may be connected between the second node n2 and the second inverter IVT2. The first inverter IVT1 may invert the signal (i.e., the detection signal DS) of the second node n2 to output the inverted detection signal IDS. A signal output from the first inverter IVT1 may be provided to the second inverter IVT2 and a gate of a fourth NMOS transistor MN4 of the level shifter 1212.

The second inverter IVT2 may be connected between the first inverter IVT1 and a gate of a fifth NMOS transistor MN5 of the level shifter 1212. The second inverter IVT2 may receive inverted detection signal IDS provided from the first inverter IVT1. The second invert IVT2 may again invert the inverted detection signal IDS to output the second detection signal DS2. A signal (i.e., the second detection signal DS2) output from the second inverter IVT2 may be provided to the gate of the fifth NMOS transistor MN5 of the level shifter 1212.

In one embodiment, each of the first and second inverters IVT1 and IVT2 may be composed of a PMOS transistor and an NMOS transistor. For example, the PMOS transistor of the first inverter IVT1 may be connected between the first power node and a sixth node (not illustrated) and may operate in response to the detection signal DS. The NMOS transistor of the first inverter IVT1 may be connected between the sixth node and the ground node and may operate in response to the detection signal DS. The first inverter IVT1 may output a signal of the sixth node as the inverted detection signal. The PMOS transistor of the second inverter IVT2 may be connected between the first power node and a seventh node (not illustrated) and may operate in response to the inverted detection signal. The NMOS transistor of the second inverter IVT2 may be connected between the seventh node and the ground node and may operate in response to the inverted detection signal. The second inverter IVT2 may output a signal of the seventh node to the gate of the fifth NMOS transistor MN5 of the level shifter 1212.

The hysteresis detector 1211 may be implemented in the form of a Schmitt trigger in which the low voltage VDD is used as a power supply voltage. The hysteresis detector 1211 may provide the level shifter 1212 with the detection signal DS having a hysteresis characteristic with respect to the input signal IS.

Unlike a conventional Schmitt trigger circuit, the hysteresis detector 1211 according to an embodiment of the present disclosure may include the third PMOS transistor MP3, which is connected with the second power node (i.e., the node of receiving the reference voltage VREF) instead of the ground node, and the third NMOS transistor MN3, which is connected with the second power node (i.e., the node of receiving the reference voltage VREF) instead of the first power node (i.e., the node of receiving the low voltage VDD). According to the above structure, the hysteresis detector 1211 may adjust a threshold voltage. That is, in the case where a voltage level of an input signal changes, the hysteresis detector 1211 may adjust a level of the first threshold voltage VIH and a level of the second threshold voltage VIL.

In one embodiment, as a voltage level of an input signal increases, the reference voltage controller 1213 may increase a level of the reference voltage VREF. As the level of the reference voltage VREF increases, the level of the first threshold voltage VIH and the level of the second threshold voltage VIL may increase.

In one embodiment, the third PMOS transistor MP3 and the third NMOS transistor MN3 of the hysteresis detector 1211 according to an embodiment of the present disclosure may operate in response to the feedback signal FS instead of the signal of the second node n2 (i.e., the detection signal DS). For example, a voltage level of the signal of the second node n2 may correspond to the low voltage (VDD) level, and a voltage level of the feedback signal FS may correspond to the high voltage (VDDH) level. That is, a voltage that is applied to gates of the third PMOS transistor MP3 and the third NMOS transistor MN3 may increase. In this case, the hysteresis detector 1211 may widen a threshold voltage range. A level difference of the first threshold voltage VIH and the second threshold voltage VIL may increase.

The level shifter 1212 may include fourth and fifth PMOS transistors MP4 and MP5 and fourth and fifth NMOS transistors MN4 and MN5. The fourth PMOS transistor MP4 may be connected between a third power node (i.e., a node of receiving the high voltage VDDH) and the fourth node n4 and may operate in response to a signal of a fifth node n5. The fifth PMOS transistor MP5 may be connected between the third power node and the fifth node n5 and may operate in response to a signal of the fourth node n4.

The fourth NMOS transistor MN4 may be connected between the fourth node n4 and the ground node and may operate in response to the inverted detection signal IDS from the first inverter IVT1. The fifth NMOS transistor MN5 may be connected between the fifth node n5 and the ground node and may operate in response to an output signal (i.e., the second detection signal) of the second inverter IVT2. In one embodiment, the fifth NMOS transistor MN5 may be modified to operate in response to the detection signal DS being the signal of the second node n2 instead of the output signal of the second inverter IVT2.

The level shifter 1212 may receive the detection signal DS or the inverted detection signal IDS, may provide the signal of the fourth node n4 to the hysteresis detector 1211 as the feedback signal FS, and may provide the signal of the fifth node n5 to the logic circuit 1230 as the output signal OS.

As described above, as the hysteresis detector 1211 uses the low voltage VDD and the level shifter 1212 uses the high voltage VDDH, a static current may be removed, and the area may be optimized. The hysteresis detector 1211 may adjust the first and second threshold voltages VIH and VIL by using the reference voltage VREF. The hysteresis detector 1211 may widen a threshold voltage range by using the feedback signal FS provided from the level shifter 1212. That is, a level difference of the first threshold voltage VIH and the second threshold voltage VIL may increase.

Figure 7A:
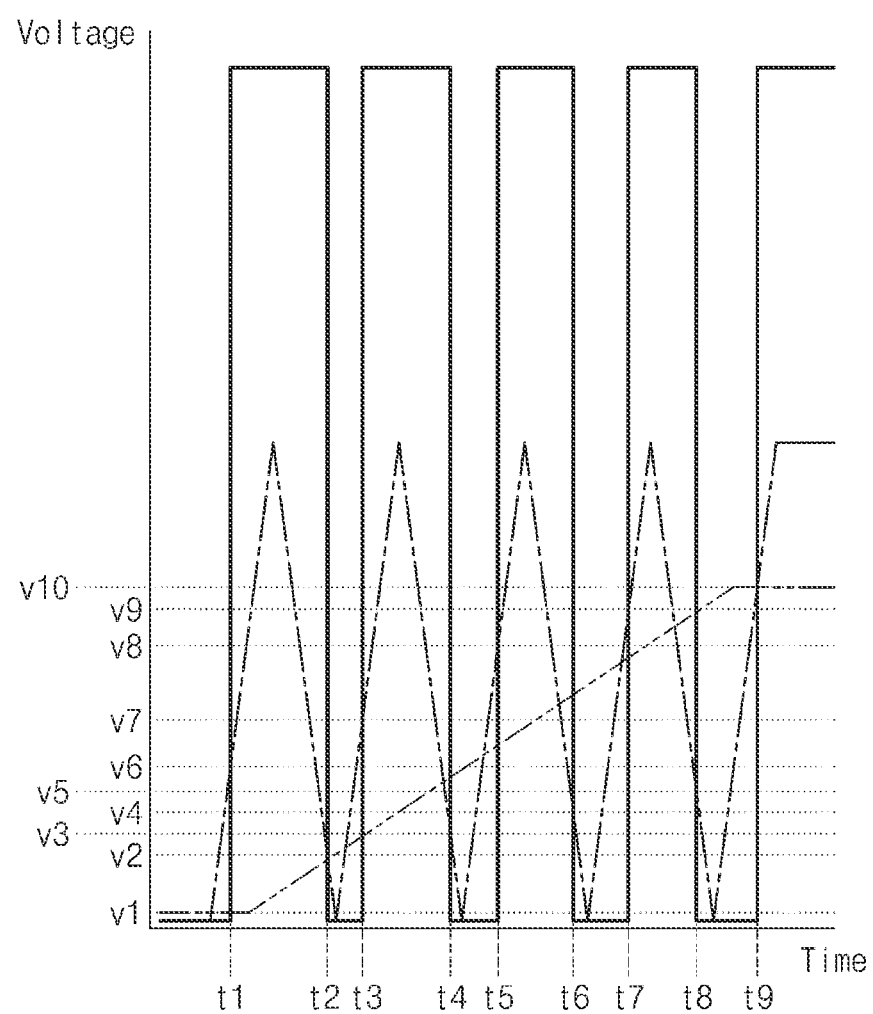
FIGS. 7A and 7B are graphs illustrating an output signal according to a change of a reference voltage of a receiving circuit.
Figure 7B:
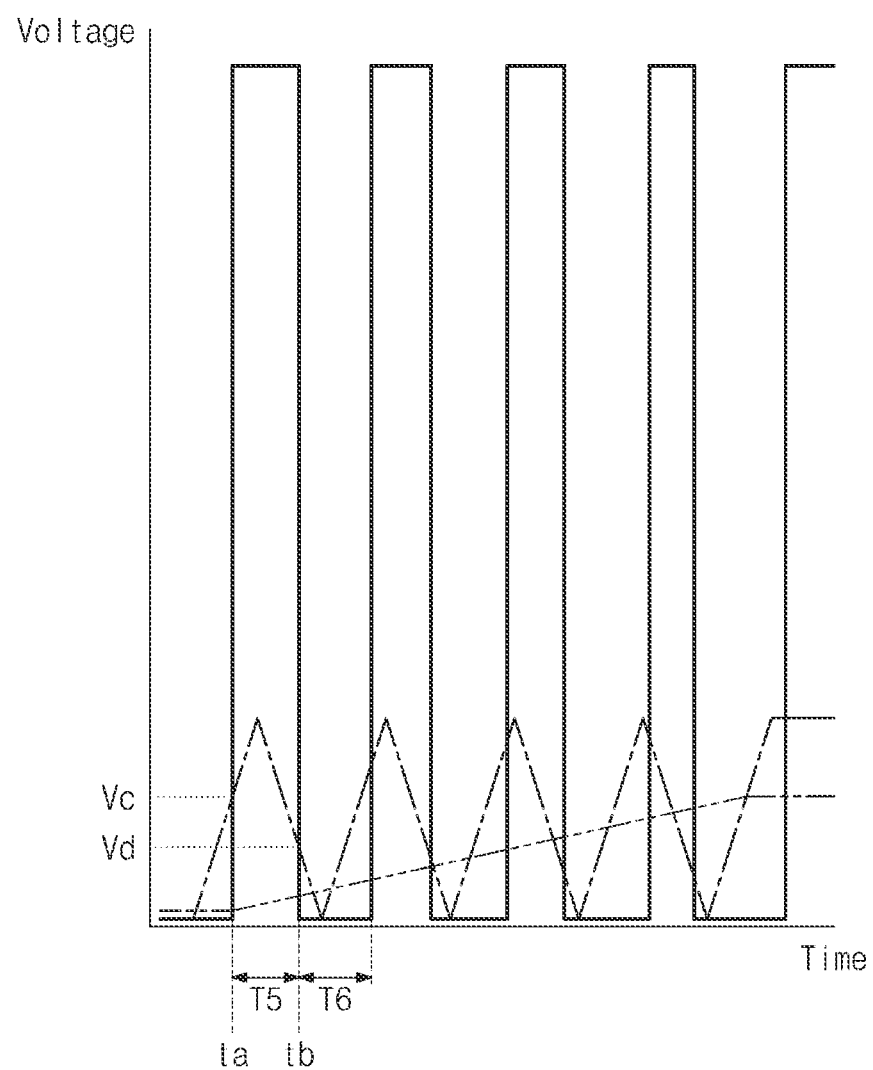

FIGS. 7A and 7B are graphs illustrating an output signal according to a change of a reference voltage of a receiving circuit. An embodiment in which the first input signal having the swing range of the low voltage (VDD) level is received is illustrated in FIG. 7A, and an embodiment in which the second input signal having the swing range of the level (e.g., VDD/2) lower than the low voltage (VDD) level is received is illustrated in FIG. 7B. In FIGS. 7A and 7B, a horizontal axis represents a time, and a vertical axis represents a voltage.

To describe the present disclosure clearly, in FIG. 7A, the first input signal is illustrated by a dash-single dotted line, the first output signal is illustrated by a solid line, and a first reference voltage is illustrated by a two dot-dash line. In FIG. 7B, the second input signal is illustrated by a dash-single dotted line, the second output signal is illustrated by a solid line, and a second reference voltage is illustrated by a two dot-dash line. The graphs illustrated in FIGS. 7A and 7B are only for describing an effect according to embodiments of the present disclosure, and the present disclosure is not limited thereto.

It is confirmed from FIGS. 1 and 7A that a level of the first threshold voltage VIH and a level of the second threshold voltage VIL increase as a first reference voltage VREF increases. For example, during a time period from a first time t1 to a ninth time t9, a level of the first reference voltage VREF may increase from a first value v1 to a tenth value v10.

At the first time t1, the first output signal may transition from logic low to logic high. In this case, the level of the first threshold voltage VIH may correspond to the sixth value v6. At the third time t3, the first output signal may transition from logic low to logic high. In this case, the level of the first threshold voltage VIH may correspond to the seventh value v7. At the fifth time t5, the first output signal may transition from logic low to logic high. In this case, the level of the first threshold voltage VIH may correspond to the eighth value v8. At the seventh time t7, the first output signal may transition from logic low to logic high. In this case, the level of the first threshold voltage VIH may correspond to the ninth value v9. At the ninth time t9, the first output signal may transition from logic low to logic high. In this case, the level of the first threshold voltage VIH may correspond to the tenth value v10.

The seventh value v7 may be greater than the sixth value v6, the eighth value v8 may be greater than the seventh value v7, the ninth value v9 may be greater than the eighth value v8, and the tenth value v10 may be greater than the ninth value v9. That is, as the level of the first reference voltage VREF increases from the first value v1 to the tenth value v10, the level of the first threshold voltage VIH may increase from the sixth value v6 to the tenth value v10.

At the second time t2, the first output signal may transition from logic high to logic low. In this case, the level of the second threshold voltage VIL may correspond to the second value v2. At the fourth time t4, the first output signal may transition from logic high to logic low. In this case, the level of the second threshold voltage VIL may correspond to the third value v3. At the sixth time t6, the first output signal may transition from logic high to logic low. In this case, the level of the second threshold voltage VIL may correspond to the fourth value v4. At the eighth time t8, the first output signal may transition from logic high to logic low. In this case, the level of the second threshold voltage VIL may correspond to the fifth value v5.

The third value v3 may be greater than the second value v2, the fourth value v4 may be greater than the third value v3, and the fifth value v5 may be greater than the fourth value v4. That is, as the level of the first reference voltage VREF increases from the first value v1 to the tenth value v10, the level of the second threshold voltage VIL may increase from the second value v2 to the fifth value v5.

In a receiving circuit that includes a conventional Schmitt trigger circuit, as a bias voltage or a reference voltage increases, the level of the first threshold voltage VIH increases, and the level of the second threshold voltage VIL decreases. In contrast, in the receiving circuit 1210 according to an embodiment of the present disclosure, both the level of the first threshold voltage VIH and the level of the second threshold voltage VIL may increase. Like the graph of FIG. 7A, it is confirmed from FIG. 7B that the level of the first threshold voltage VIH and the level of the second threshold voltage VIL increase as a second reference voltage VREF increases.

Returning to the graph of FIG. 2B, the level of the first threshold voltage VIH (e.g., the first voltage Va) and the level of the second threshold voltage VIL (e.g., the second voltage Vb) may be set to be relatively high compared to the second input signal. As such, the third time period T3 may be relatively short, and the fourth time period T4 may be relatively long. In contrast, the receiving circuit 1210 according to an embodiment of the present disclosure may adjust the level of the first threshold voltage VIH and the level of the second threshold voltage VIL by adjusting the reference voltage VREF.

Referring to the graph of FIG. 7B, at a first time ta, the second output signal may transition from logic low to logic high. The level of the first threshold voltage VIH (e.g., a third voltage Vc) may be lower than the level of the first threshold voltage VIH (e.g., the first voltage Va) of FIG. 2B. At a second time tb, the second output signal may transition from logic high to logic low. The level of the second threshold voltage VIL (e.g., a fourth voltage Vd) may be lower than the level of the second threshold voltage VIL (e.g., the second voltage Vb) of FIG. 2B. As such, the second output signal may be maintained at logic high during a fifth time period T5 longer than the third time period T3. Also, the second output signal may be maintained at logic low during a sixth time period T6 shorter than the fourth time period T4. That is, the receiving circuit may provide the second output signal in which the fifth time period T5 and the sixth time period T6 are balanced.

As described above, to provide a stable output signal when a voltage level of an input signal is variable, the receiving circuit 1210 may adjust the level of the reference voltage VREF. As the level of the reference voltage VREF changes, the level of the first threshold voltage VIH and the level of the second threshold voltage VIL may change.

Figure 8:
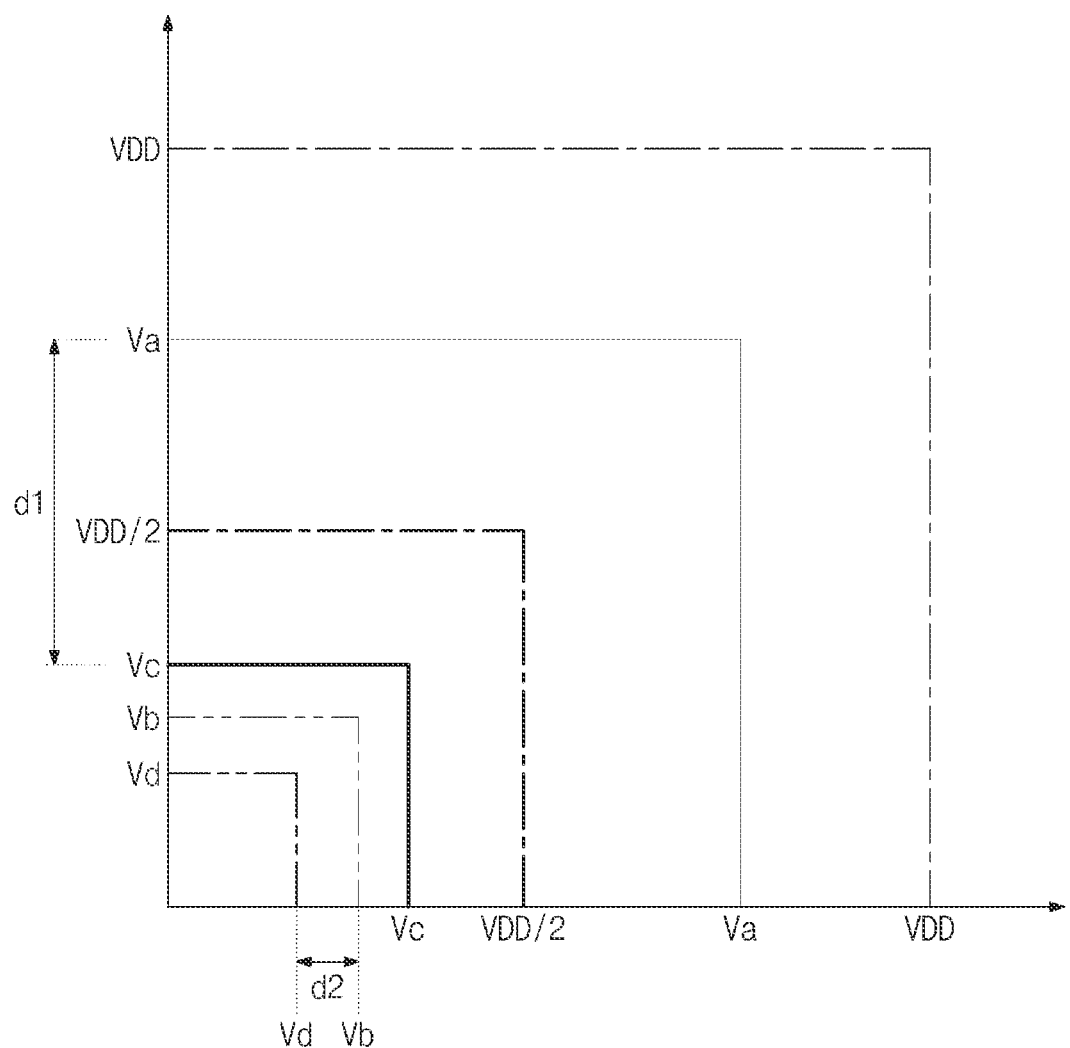
FIG. 8 is a graph illustrating changes of threshold voltages according to a change of a reference voltage.

FIG. 8 is a graph illustrating changes of threshold voltages according to a change of a reference voltage. In FIG. 8, a horizontal axis and a vertical axis represent a time. In FIG. 8, to describe an effect of the present disclosure clearly, the first input signal having the swing range of the low voltage (VDD) level is illustrated by a light dash-single dotted line, the first threshold voltage VIH of the first input signal is illustrated by a light solid line, and the second threshold voltage VIL of the first input signal is illustrated by a light two dot-dash line. The second input signal having the swing range of the level (e.g., VDD/2) lower than the low voltage (VDD) level is illustrated by a heavy dash-single dotted line, the first threshold voltage VIH of the second input signal is illustrated by a heavy solid line, and the second threshold voltage VIL of the second input signal is illustrated by a heavy two dot-dash line. The graph illustrated in FIG. 8 is only for describing an effect according to embodiments of the present disclosure, and the present disclosure is not limited thereto.

For example, the level of the first threshold voltage VIH of the first input signal may correspond to the first voltage Va, and the level of the second threshold voltage VIL of the first input signal may correspond to the second voltage Vb. The level of the first threshold voltage VIH of the second input signal may correspond to the third voltage Vc, and the level of the second threshold voltage VIL of the second input signal may correspond to the fourth voltage Vd. The second voltage Vb may be greater than the fourth voltage Vd, the third voltage Vc may be greater than the second voltage Vb, and the first voltage Va may be greater than the third voltage Vc.

A difference between the first voltage Va and the third voltage Vc may correspond to a first difference d1, and a difference between the second voltage Vb and the fourth voltage Vd may correspond to a second difference d2. The first difference d1 may be relatively great compared to the second difference d2. That is, as the reference voltage VREF changes, the level of the first threshold voltage VIH may change with a greater voltage width than the level of the second threshold voltage VIL. As such, the receiving circuit 1210 may provide a stable output signal.

As described above, the receiving circuit 1210 may control the first threshold voltage VIH and the second threshold voltage VIL by controlling a magnitude of the reference voltage VREF. According to the above description, even though a voltage level of an input signal changes, the receiving circuit 1210 may adjust the first threshold voltage VIH and the second threshold voltage VIL to provide a stable output signal. In addition, the receiving circuit 1210 may change the first threshold voltage VIH with a relatively great voltage width and may change the second threshold voltage VIL with a relatively small voltage width.

Figure 9A:
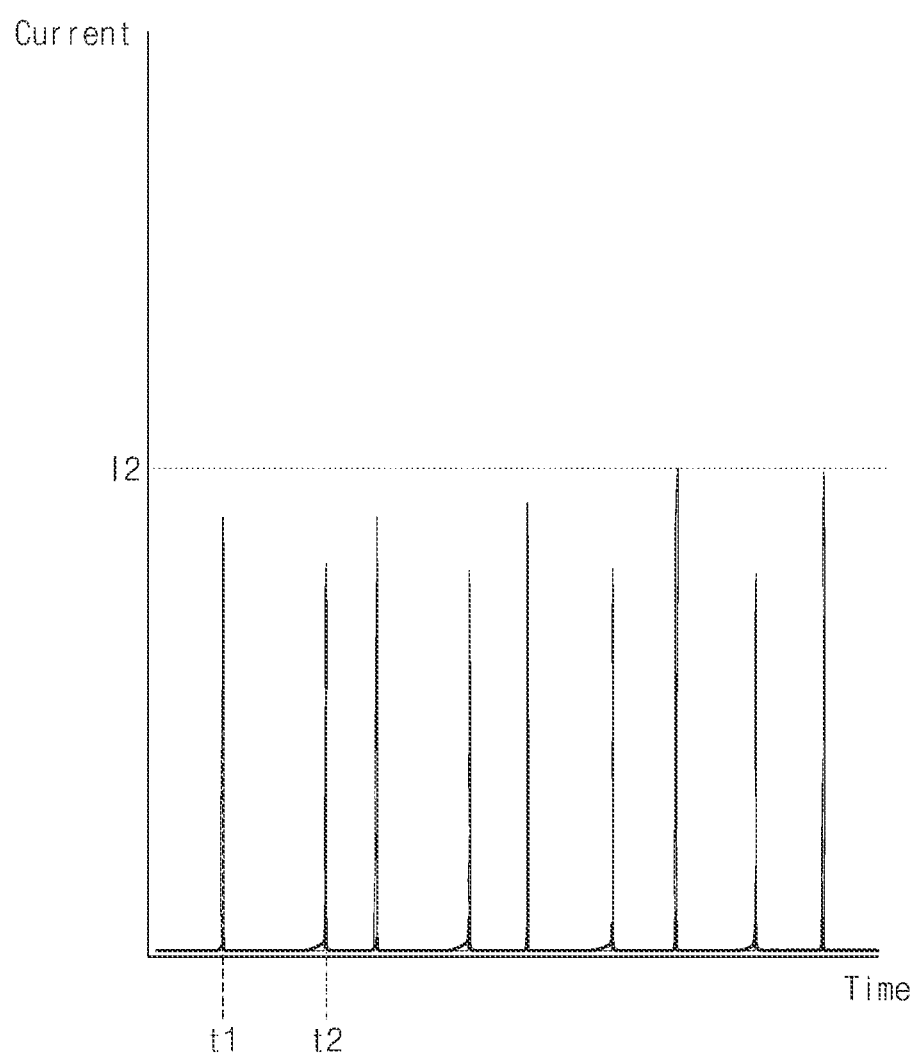
FIGS. 9A and 9B are graphs illustrating current consumption of a receiving circuit.
Figure 9B:
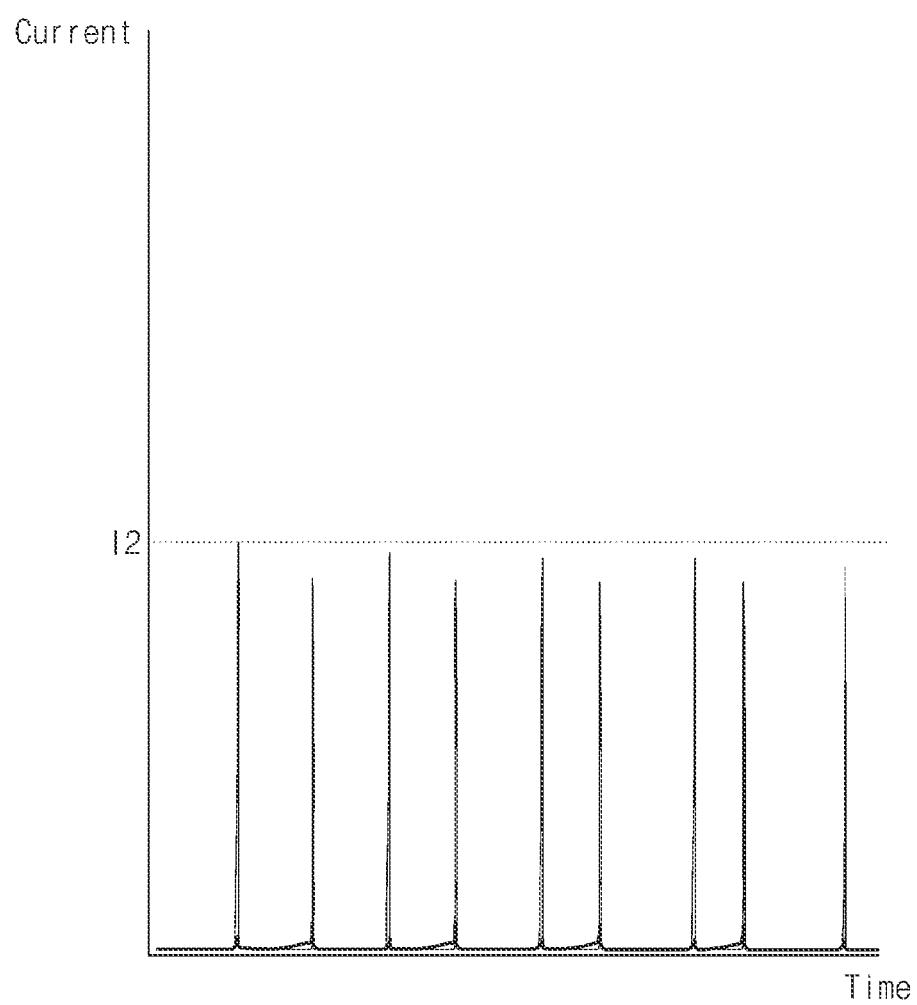

FIGS. 9A and 9B are graphs illustrating current consumption of a receiving circuit. An embodiment in which the first input signal having the swing range of the low voltage (VDD) level is received is illustrated in FIG. 9A, and an embodiment in which the second input signal having the swing range of the level (e.g., VDD/2) lower than the low voltage (VDD) level is received is illustrated in FIG. 9B. In FIGS. 9A and 9B, a horizontal axis represents a time, and a vertical axis represents a current. A solid line represents current consumption associated with the low voltage VDD, and a bold line represents current consumption associated with the high voltage VDDH.

Compared to the graphs of FIGS. 3A and 3B, it is confirmed from the graphs of FIGS. 9A and 9B that the area below the solid line is reduced. That is, the receiving circuit 1210 according to an embodiment of the present disclosure may reduce a static current or a leakage current. That is, even though an input signal having a swing range of a level lower than a power supply voltage level is received, the receiving circuit 1210 may prevent the occurrence of a static current.

Even though an output signal is not illustrated in FIGS. 9A and 9B, a peak current may be generated when the output signal transitions from logic low to logic high or transitions from logic high to logic low. For example, at a first time t1 and a second time t2, a peak current, that is, a second current I2 corresponding to a maximum current may be generated. The amount of the second current I2 may be smaller than the amount of the first current I1 of FIGS. 3A and 3B. That is, even though a peak current is generated, the receiving circuit 1210 according to an embodiment of the present disclosure may reduce the peak current.

Figure 10:
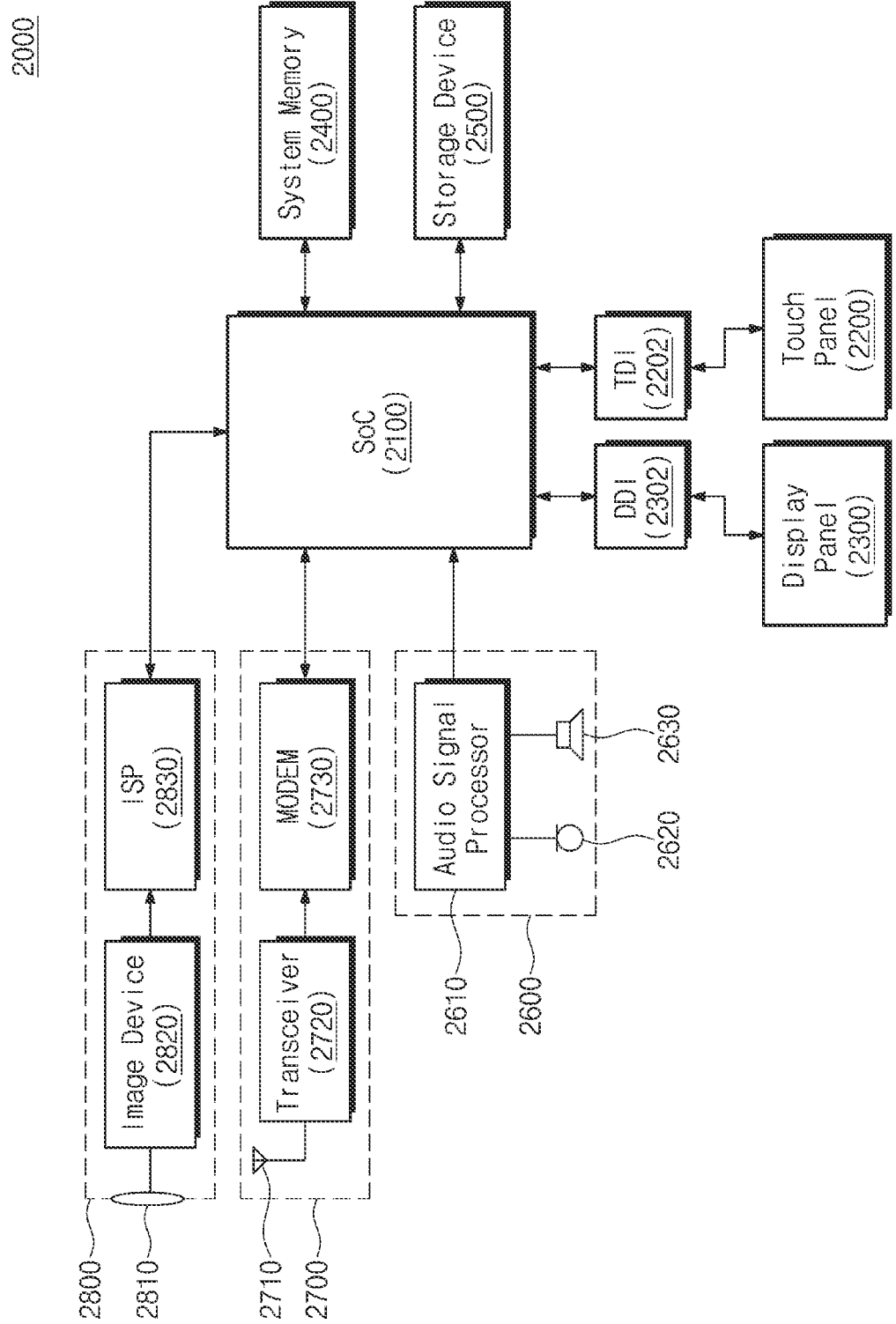
FIG. 10 is a block diagram illustrating an electronic device according to the present disclosure.

FIG. 10 is a block diagram illustrating an electronic device according to the present disclosure. FIG. 10 is a block diagram illustrating an electronic device according to the present disclosure. Referring to FIG. 10, an electronic device 2000 may include a SoC 2100, a touch panel 2200, a touch driver integrated circuit 2202, a display panel 2300, a display driver integrated circuit 2302, a system memory 2400, a storage device 2500, an audio processor 2600, a communication block 2700, and an image processor 2800. In one embodiment, the electronic device 2000 may be one of various electronic devices such as a portable communication terminal, a personal digital assistant (PDA), a portable media player (PMP), a digital camera, a smartphone, a tablet computer, a laptop computer, and a wearable device.

The SoC 2100 may control overall operations of the electronic device 2000. The SoC 2100 may control/manage operations of the components of the electronic device 2000. The SoC 2100 may process various operations for the purpose of operating the electronic device 2000.

The touch panel 2200 may be configured to sense a touch input from a user under control of the touch driver integrated circuit 2202. The display panel 2300 may be configured to display image information under control of the display driver integrated circuit 2302.

The system memory 2400 may store data that are used in an operation of the electronic device 2000. For example, the system memory 2400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM). In one embodiment, the system memory 2400 may be configured to reduce a static current and the area and to provide a stable output signal, as described with reference to FIGS. 1 to 9B.

The storage device 2500 may store data regardless of whether a power is supplied. For example, the storage device 2500 may include at least one of various nonvolatile memories such as a flash memory, a PRAM, an MRAM, a ReRAM, and a FRAM. For example, the storage device 2500 may include an embedded memory and/or a removable memory of the electronic device 2000.

The audio processor 2600 may process an audio signal by using an audio signal processor 2610. The audio processor 2600 may receive an audio input through a microphone 2620 or may provide an audio output through a speaker 2630.

The communication block 2700 may exchange signals with an external device/system through an antenna 2710. A transceiver 2720 and a modulator/demodulator (MODEM) 2730 of the communication block 2700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 2800 may receive a light through a lens 2810. An image device 2820 and an image signal processor (ISP) 2830 included in the image processor 2800 may generate image information about an external object, based on a received light.

As described above, a mobile electronic device may be small-sized and may consume only a limited power. Even though a system memory according to an embodiment of the present disclosure receives an input signal corresponding to a low voltage level, the system memory may provide a stable output signal to a logic circuit and may reduce a static current.

According to the present disclosure, a receiving circuit may receive an input signal, of which a voltage level is lower than a power supply voltage level, may output a signal having a hysteresis characteristic, and may adjust levels of threshold voltages. Accordingly, the receiving circuit processing a low voltage signal having an improved hysteresis is provided.

While the present disclosure has been described with reference to one or more embodiments thereof, it will be apparent to those of ordinary skill in the art that various changes and modifications may be made thereto without departing from the spirit and scope of the present disclosure as set forth in the following claims.

What is claimed is:

1. A receiving circuit comprising:
    a hysteresis detector configured to receive an input signal corresponding to a first voltage level and to output a detection signal having a first threshold voltage and a second threshold voltage; and
    a level shifter configured to receive the detection signal, to convert the first voltage level of the detection signal to a second voltage level higher than the first voltage level so as to be output as an output signal, and to output a feedback signal of the second voltage level,
    wherein the hysteresis detector receives the feedback signal from the level shifter and adjusts the first threshold voltage and the second threshold voltage based on the feedback signal.

2. The receiving circuit of claim 1, wherein the hysteresis detector includes:
    a first PMOS transistor connected between a node of receiving a first power supply voltage and a first node and configured to operate in response to the input signal;
    a second PMOS transistor connected between the first node and a second node and configured to operate in response to the input signal;
    a first NMOS transistor connected between the second node and a third node and configured to operate in response to the input signal;
    a second NMOS transistor connected between the third node and a ground node and configured to operate in response to the input signal;
    a third PMOS transistor connected between the first node and a node of receiving a reference voltage and configured to operate in response to the feedback signal;
    a third NMOS transistor connected between the third node and the node of receiving the reference voltage and configured to operate in response to the feedback signal;
    a first inverter configured to invert the detection signal being a signal of the second node to output an inverted detection signal; and
    a second inverter configured to invert the inverted detection signal to output a second detection signal.

3. The receiving circuit of claim 2, wherein the level shifter includes:
    a fourth PMOS transistor connected between a node of receiving a second power supply voltage and a fourth node and configured to operate in response to a signal of a fifth node;
    a fifth PMOS transistor connected between the node of receiving the second power supply voltage and the fifth node and configured to operate in response to a signal of the fourth node;
    a fourth NMOS transistor connected between the fourth node and the ground node and configured to operate in response to the inverted detection signal; and
    a fifth NMOS transistor connected between the fifth node and the ground node and configured to operate in response to the second detection signal.

4. The receiving circuit of claim 3, wherein the feedback signal corresponds to the signal of the fourth node, and wherein the output signal corresponds to the signal of the fifth node.

5. The receiving circuit of claim 2, wherein the first voltage level is lower than a level of the first power supply voltage.

6. The receiving circuit of claim 3, wherein the second voltage level corresponds to a level of the second power supply voltage.

7. The receiving circuit of claim 3, wherein a level of the first power supply voltage is higher than a level of the reference voltage, and a level of the second power supply voltage is higher than the level of the first power supply voltage.

8. The receiving circuit of claim 3, wherein, when a level of the input signal is equal to or higher than a level of the first threshold voltage, the output signal transitions from logic low to logic high at a rising edge of the input signal, and wherein, when the level of the input signal is lower than a level of the second threshold voltage, the output signal transitions from the logic high to the logic low at a falling edge of the input signal.

9. The receiving circuit of claim 8, wherein, as a level of the reference voltage increases, the level of the first threshold voltage increases, and the level of the second threshold voltage increases.

10. The receiving circuit of claim 8, wherein, as a level of the reference voltage increases, an increment of the level of the first threshold voltage is greater than an increment of the level of the second threshold voltage.

11. A receiving circuit comprising:
a hysteresis detector configured to receive an input signal, to output a detection signal having a first threshold voltage and a second threshold voltage, and to use a first power supply voltage and a reference voltage; and
a level shifter configured to receive the detection signal, to convert a voltage level of the detection signal so as to be output as an output signal, to provide a feedback signal to the hysteresis detector, and to use a second power supply voltage greater than the first power supply voltage,
wherein the hysteresis detector includes:
a first PMOS transistor connected between a node of receiving the first power supply voltage and a first node and configured to operate in response to the input signal;
a second PMOS transistor connected between the first node and a second node and configured to operate in response to the input signal;
a first NMOS transistor connected between the second node and a third node and configured to operate in response to the input signal;
a second NMOS transistor connected between the third node and a ground node and configured to operate in response to the input signal;

a third PMOS transistor connected between the first node and a node of receiving the reference voltage and configured to operate in response to the feedback signal;
a third NMOS transistor connected between the third node and the node of receiving the reference voltage and configured to operate in response to the feedback signal;
a first inverter configured to receive the detection signal and to invert the detection signal so as to be output as an inverted detection signal; and
a second inverter configured to receive the inverted detection signal and to invert the inverted detection signal so as to be output as an second detection signal, and
wherein the level shifter includes:
a fourth PMOS transistor connected between a node of receiving the second power supply voltage and a fourth node and configured to operate in response to a signal of a fifth node;
a fifth PMOS transistor connected between the node of receiving the second power supply voltage and the fifth node and configured to operate in response to a signal of the fourth node;
a fourth NMOS transistor connected between the fourth node and the ground node and configured to operate in response to the inverted detection signal; and
a fifth NMOS transistor connected between the fifth node and the ground node and configured to operate in response to the second detection signal.

12. The receiving circuit of claim 11, further comprising:
a reference voltage controller configured to receive the input signal and to adjust a level of the reference voltage based on a voltage level of the input signal.

13. The receiving circuit of claim 11, wherein, when a level of the input signal is equal to or higher than a level of the first threshold voltage, the output signal transitions from logic low to logic high at a rising edge of the input signal, and wherein, when the level of the input signal is lower than a level of the second threshold voltage, the output signal transitions from the logic high to the logic low at a falling edge of the input signal.

14. The receiving circuit of claim 11, wherein the hysteresis detector adjusts a level of the first threshold voltage and a level of the second threshold voltage based on a level of the reference voltage.

15. The receiving circuit of claim 11, wherein a voltage level of the input signal is variable and is equal to or lower than a level of the first power supply voltage.

16. The receiving circuit of claim 11, wherein a voltage level of the feedback signal is equal to or higher than a level of the first power supply voltage.

* * * * *